(12) United States Patent
Rajan et al.

(10) Patent No.: US 8,773,013 B2
(45) Date of Patent: Jul. 8, 2014

(54) THREE DIMENSIONAL OLED LAMPS

(75) Inventors: Kamala Rajan, Ewing, NJ (US);
Prashant Mandlik, Ewing, NJ (US);
Huiqing Pang, Ewing, NJ (US); Peter Levermore, Ewing, NJ (US); Paul E. Burrows, Ewing, NJ (US); Ruiqing Ma, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 485 days.

(21) Appl. No.: 13/106,510

(22) Filed: May 12, 2011

(65) Prior Publication Data

US 2012/0286649 A1 Nov. 15, 2012

(51) Int. Cl.
*H01J 1/62* (2006.01)
*H01J 63/04* (2006.01)

(52) U.S. Cl.
USPC ........................................... 313/504; 313/511

(58) Field of Classification Search
USPC ............ 313/511, 504, 512; 428/690; 362/800
See application file for complete search history.

(56) References Cited

U.S. PATENT DOCUMENTS

| | | | |
|---|---|---|---|
| 4,066,925 A * | 1/1978 | Dickson | 313/503 |
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,771,021 B2 | 8/2004 | Cok | |
| 6,787,990 B2 | 9/2004 | Cok | |
| 7,049,757 B2 | 5/2006 | Foust et al. | |
| 7,075,226 B2 | 7/2006 | Cok | |
| 7,279,704 B2 | 10/2007 | Walters et al. | |
| 7,431,968 B1 | 10/2008 | Shtein et al. | |
| D609,842 S | 2/2010 | Ngai et al. | |
| D609,843 S | 2/2010 | Ngai et al. | |
| D609,844 S | 2/2010 | Ngai et al. | |
| D609,845 S | 2/2010 | Ngai et al. | |
| D609,846 S | 2/2010 | Ngai et al. | |

(Continued)

OTHER PUBLICATIONS

Bickley, W.G, "The Heavy Elastica," *The London, Edinburgh, and Dublin Philosophical Magazine and Journal of Science*, vol. XVII, 7th Series, Taylor and Francis (London, England), pp. 603-622, Jan.-Jun. 1934.

(Continued)

*Primary Examiner* — Nimeshkumar Patel
*Assistant Examiner* — Glenn Zimmerman
(74) *Attorney, Agent, or Firm* — Sterne, Kessler, Goldstein & Fox P.L.L.C.

(57) ABSTRACT

Novel three dimensional OLEDs are provided. The OLEDs have two configurations, and are self supporting in the three dimensional configuration without the need for any external supports.

34 Claims, 8 Drawing Sheets

(a)

(b)

(56) References Cited

U.S. PATENT DOCUMENTS

| | | |
|---|---|---|
| D610,299 S | 2/2010 | Ngai et al. |
| D613,449 S | 4/2010 | Ngai et al. |
| D618,842 S | 6/2010 | Ngai et al. |
| D622,894 S | 8/2010 | Ngai et al. |
| D623,793 S | 9/2010 | Ngai et al. |
| D623,794 S | 9/2010 | Ngai et al. |
| D623,795 S | 9/2010 | Ngai et al. |
| 8,115,370 B2 * | 2/2012 | Huang .............. 313/46 |
| 2003/0230980 A1 | 12/2003 | Forrest et al. |
| 2004/0174116 A1 | 9/2004 | Lu et al. |
| 2005/0045900 A1 * | 3/2005 | Silvernail ............ 257/99 |
| 2005/0287686 A1 * | 12/2005 | Won .................. 438/22 |
| 2008/0018244 A1 * | 1/2008 | Anandan ............. 313/511 |
| 2010/0295032 A1 | 11/2010 | Kwong et al. |
| 2011/0057559 A1 | 3/2011 | Xia et al. |
| 2011/0163683 A1 * | 7/2011 | Steele et al. ........ 315/192 |
| 2011/0188189 A1 * | 8/2011 | Park et al. ....... 361/679.05 |

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

Rogers et al. "Optical evaluation of the flexural rigidity and residual stress in thin membranes: Picosecond transient grating measurements of the dispersion of the lowest-order Lamb acoustic waveguide mode" J. Mater. Res., vol. 16, No. 1, Jan. 2001, pp. 217-225.

NASA Technical Note D-3270: Techniques for the Measurement of the Flexural Rigidity of Thin Films and Laminates, H. L. Price, Apr. 1966.

BS 3356:1990, British Standard Method for Determination of Bending Length and Flexural Rigidity of Fabrics, British Standards Institution © 1999.

* cited by examiner (a)

(b)

THREE DIMENSIONAL OLED LAMPS

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to lighting devices, and in particular to three dimensional organic light emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

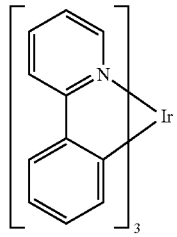

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

In one aspect, a first device is provided. The first device comprises a flexible substrate having at least one flexible organic light emitting device (OLED) deposited thereon, the first device having at least two configurations. The first device has a first configuration wherein the first device is flat, and a second configuration wherein the first device has a three dimensional shape not constrained by any fixture, and the flexible substrate and OLED have a sufficient flexural rigidity to maintain the three dimensional shape. Additionally, the first device comprises at least one structurally weakened region.

In one aspect, the at least one structurally weakened region comprises a cut region. In another aspect, the at least one structurally weakened region comprises a scored region. In another aspect, the at least one structurally weakened region comprises a perforated region. In another aspect, the at least one structurally weakened region comprises a folded region. In one aspect, the at least structurally weakened region is formed prior to OLED deposition. In one aspect, no complete OLED is deposited on the at least one structurally weakened region. In one aspect, the first device is folded along the at least one structurally weakened region.

In one aspect, the OLED is in direct contact with the surface of the first device. In another aspect, at least one layer is present between the OLED and the surface of the first device. In one aspect, the OLED is deposited on at least 30% of the surface of the first device.

In one aspect, the three dimensional shape is a conical spiral. In one aspect, the first device is a lamp. In another aspect, the OLED conforms to the shape of the first device.

In one aspect, the first device is attached to at least one contact region.

In one aspect, the first device comprises metal foil, plastic, fabric, glass, paper or combinations thereof. In one aspect, the metal foil comprises an aluminum foil, stainless steel foil, copper foil or combinations thereof. In one aspect, the stainless steel foil has a thickness of about 20 microns to about 150 microns. In another aspect, the plastic comprises polyethylene terephthalate, polyethylene naphthalate, or combinations thereof. In one aspect, the plastic has a thickness of about 40 microns to about 400 microns. In another aspect, the glass comprises a flexible glass. In one aspect, the flexible glass comprises borosilicate glass with a thickness of about 50 microns to about 500 microns. In one aspect, the metal foil comprises aluminum foil. In one aspect, the aluminum foil has a thickness of about 30 microns to about 300 microns.

In one aspect, the first device further comprises an insulating material deposited between the surface of the first device and the OLED. In one aspect, the insulating material comprises a polyimide layer. In one aspect, the polyimide layer has a thickness of about 2 microns to about 20 microns. In one aspect, the insulating material comprises an inorganic dielectric layer.

In one aspect, the OLED comprises a single pixel. In another aspect, the OLED comprises a plurality of pixels. In one aspect, the plurality of pixels are connected in series. In one aspect, the plurality of pixels are connected in parallel.

In one aspect, the OLED is covered with a thin film encapsulation layer. In one aspect, the at least one structurally weakened region is substantially free of the thin film encapsulation layer. In another aspect, a hard coat layer is present on top of the thin film encapsulation layer. In one aspect, the thin film encapsulation layer has a thickness of less than 10 microns.

In one aspect, the bending length of the first device is about 1.0 cm to about 25.0 cm. In another aspect, the bending length of the first device is about 3.0 cm to about 15.0 cm.

In one aspect, the first device has a flexural rigidity of about $10^{-1}$ Nm to about $10^{-6}$ Nm. In one aspect, at least one structurally weakened region is formed prior to OLED deposition. In one aspect, the flexible substrate is folded along at least one structurally weakened region. In one aspect, the flexible substrate is self-supporting. In one aspect, one or more edges of the first device comprise a protective coating. In one aspect, the first device contains no transistors.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
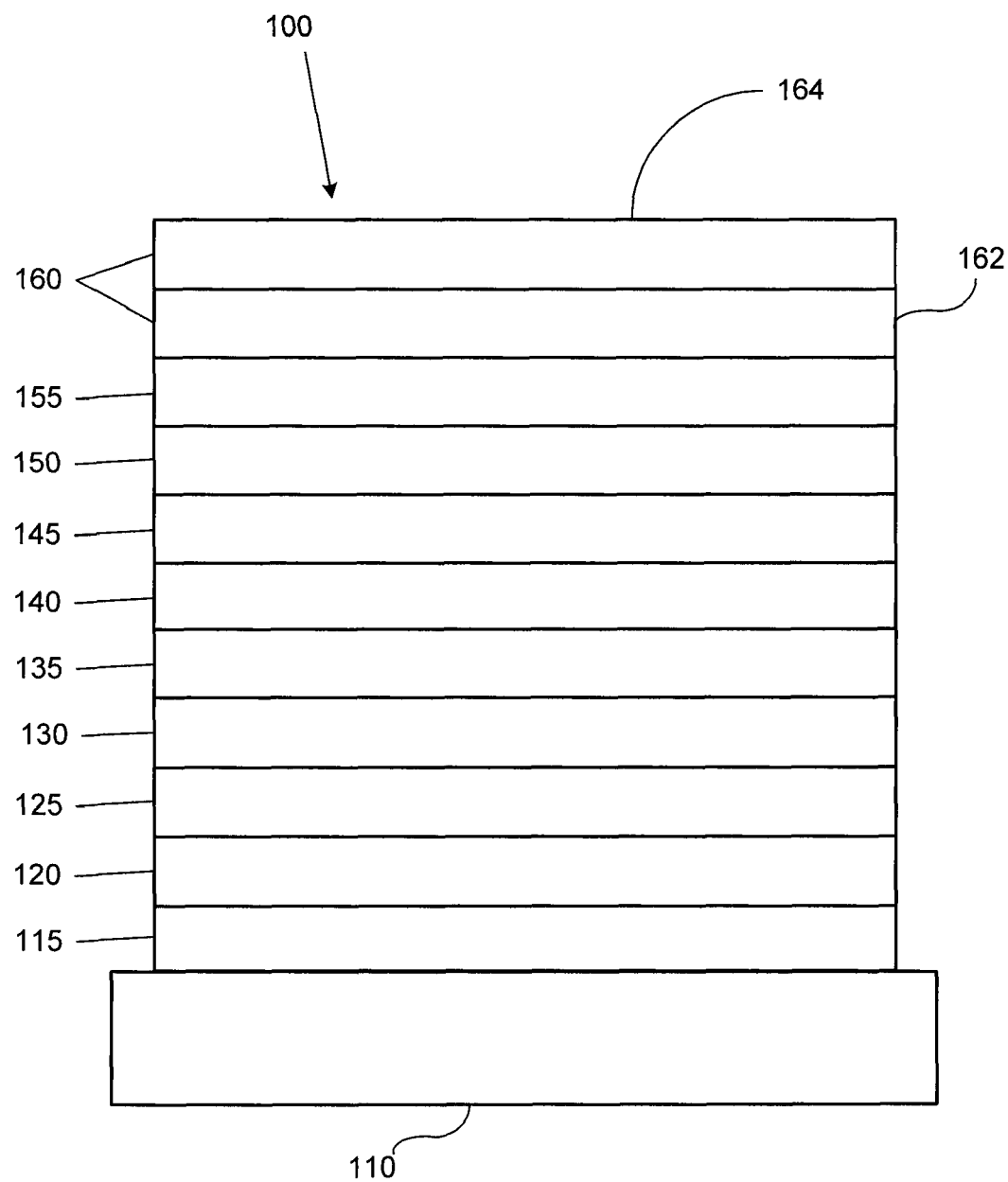
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279, 704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
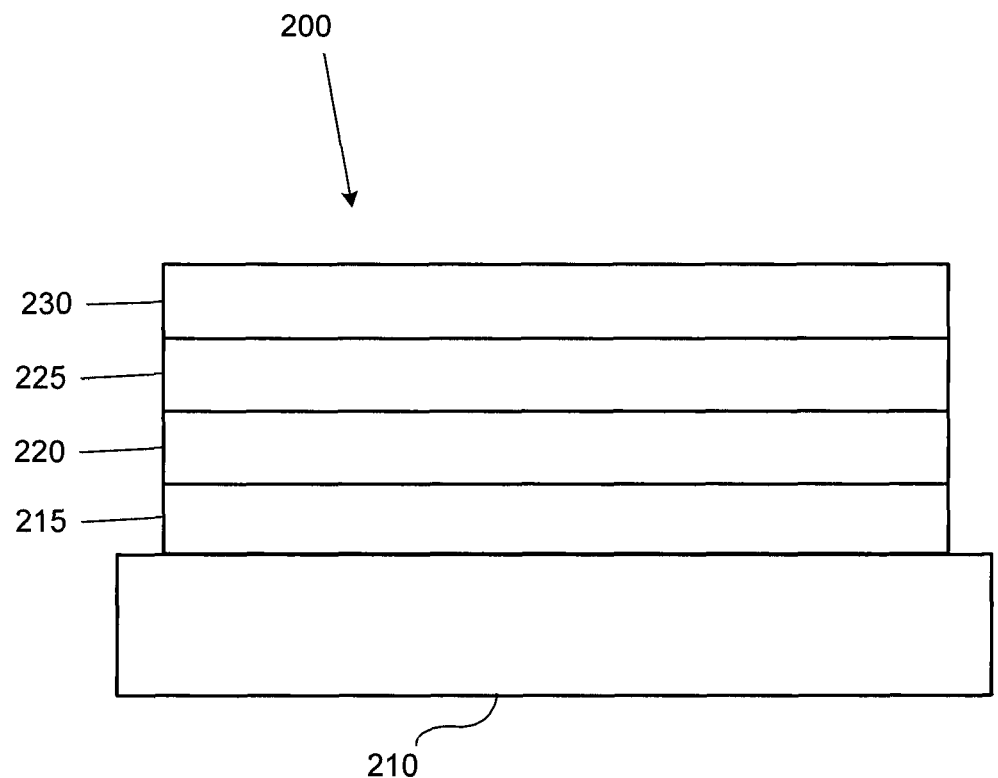
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures.

More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

In one embodiment, a first device is provided. The first device comprises a flexible substrate having at least one flexible organic light emitting device (OLED) deposited thereon, the first device having at least two configurations. The first device has a first configuration wherein the first device is flat, and a second configuration wherein the first device has a three dimensional shape not constrained by any fixture, and the flexible substrate and OLED have a sufficient flexural rigidity to maintain the three dimensional shape. Additionally, the first device comprises at least one structurally weakened region. The first device as described above, is particularly suited for lighting applications, particularly decorative lighting applications. In one embodiment, the first device contains no transistors, and is not adapted for display purposes.

The shape of the first device in the second configuration is not defined by a fixture external to the OLED, i.e. the flexible OLED is not held in a fixture. Maintaining a three dimensional shape relies on selecting a substrate material with an appropriate combination of Young's modulus, bending length, flexural rigidity, and similar properties, to hold the first device in a defined three dimensional shape. For example, a substrate requires sufficiently low flexural rigidity so that it may be conformed from a planar orientation to a three dimensional shape, but sufficiently high flexural rigidity so that it can maintain that three dimensional shape without collapsing under its own weight.

In one embodiment, the at least one structurally weakened region comprises a cut region. In another embodiment, the at least one structurally weakened region comprises a scored region. In another embodiment, the at least one structurally weakened region comprises a perforated region. In another embodiment, the at least one structurally weakened region comprises a folded region. Structurally weakened regions may be made using art-recognized cutting procedures capable of working with the materials disclosed herein. Exemplary cutting procedures include, but are not limited to, wet chemical etching, plasma etching, laser cutting, and mechanical cutting.

A cut region is a portion of the surface of the flexible substrate where a cutting procedure has penetrated both the top and bottom surfaces of the flexible substrate. In a preferred embodiment, the cut lines have rounded ends, to minimize the risk of tearing the substrate upon formation of the three dimensional configuration. In one embodiment, the rounded ends comprise circular holes in the substrate at each end of the cut. In a scored region, on the other hand, a cutting procedure has penetrated only partly through the top (or bottom) surface of the flexible substrate. Preferably, the score is made on the side of the flexible substrate that is not used for OLED deposition, which allows bus lines or electrical interconnects to pass over the scored regions. The flexible substrate can be mounted on a rigid carrier substrate for ease of handling during the manufacturing process.

A perforated region is a portion of the surface of the flexible substrate that has alternating cut and uncut regions, or alternating scored and unscored regions, or combinations thereof. A folded region is a region where the flexible substrate has been folded. In one embodiment, the first device is folded along a structurally weakened region where there is a cut, score, or perforation. In one embodiment, no complete OLED is deposited on the at least one structurally weakened region. Depositing a complete OLED on the at least one structurally weakened region can result in delamination and short circuit or open circuit failure when the first device adopts a shape in the second configuration. In one embodiment, the at least one structurally weakened region is formed prior to OLED deposition.

By "no complete OLED is deposited on a structurally weakened region" it is meant that the emissive area of the OLED and any surrounding area of the OLED needed for device operation is not deposited in or on the structurally weakened region. This may generally correspond to no component organic materials of the organic layers being deposited in or on the structurally weakened region, but some overlap may be permissible. Overspray of extra organic or other material not used within the OLED is permissible. In certain embodiments it is acceptable for bus lines or electrical interconnects to pass over or through a structurally weakened region. Depositing an OLED on a structurally weakened region could result in short circuits when the device is expanded into a non-planar configuration. This is especially important when the structurally weakened region is formed after deposition of the thin film encapsulation layer.

In one embodiment, the at least one structurally weakened region allows the first device to form a three dimensional shape without damaging the OLED. In one embodiment, the at least one structurally weakened region allows the first device to form a three dimensional shape where there is minimal strain in the device in region where the OLED is deposited. Specifically, the mid-plane of the substrate remains substantially unstrained in the three dimensional configuration in the region where the OLED is deposited.

For example, where the device is folded along the at least one structurally weakened region, the device may form a three dimensional shape, where the strain associated with forming the three-dimensional shape is concentrated on the at least one structurally weakened region, and where there is minimal strain in the device on either side of the at least one structurally weakened region in the regions where the OLED is deposited. In one embodiment, the first device may form a three dimensional shape with substantially no plastic deformation within the active area of the OLED device, though there may be plastic deformation on or around the structurally weakened region.

Preferably, where the structurally weakened region is cut, scored, or perforated, the structurally weakened region is made prior to OLED deposition to avoid potential damage to the OLED stack. After cutting, scoring, or perforation, the OLED may be deposited on the flexible substrate. The flexible substrate and OLED can then be shaped according to the desired design. Shaping of the flexible substrate and OLED may include folding the flexible substrate. FIG. 3(e) shows the cut marks made in a flexible substrate to obtain, in one embodiment, a conical spiral.

In one embodiment, the OLED is in direct contact with the surface of the first device. In another embodiment, at least one layer is present between the OLED and the surface of the first device. Depositing the OLED on at least one layer between the flexible substrate allows for the tuning of the properties of the overall first device, for example, and without limitation, by increasing the rigidity of the flexible substrate or changing the optical properties of the OLED. The at least one layer present between the OLED and the surface of the substrate can be, without limitation: an insulating layer that can electrically isolate the substrate from the OLED, a layer that planarizes the substrate surface to reduce surface roughness, a layer that can improve adhesion of the other OLED layers, and a layer that can act as a permeation barrier. Preferably the OLED is deposited on at least 30% of the surface of the first device. This amount of OLED coverage allows for sufficient light output for a variety of consumer or commercial applications.

Figure 7:
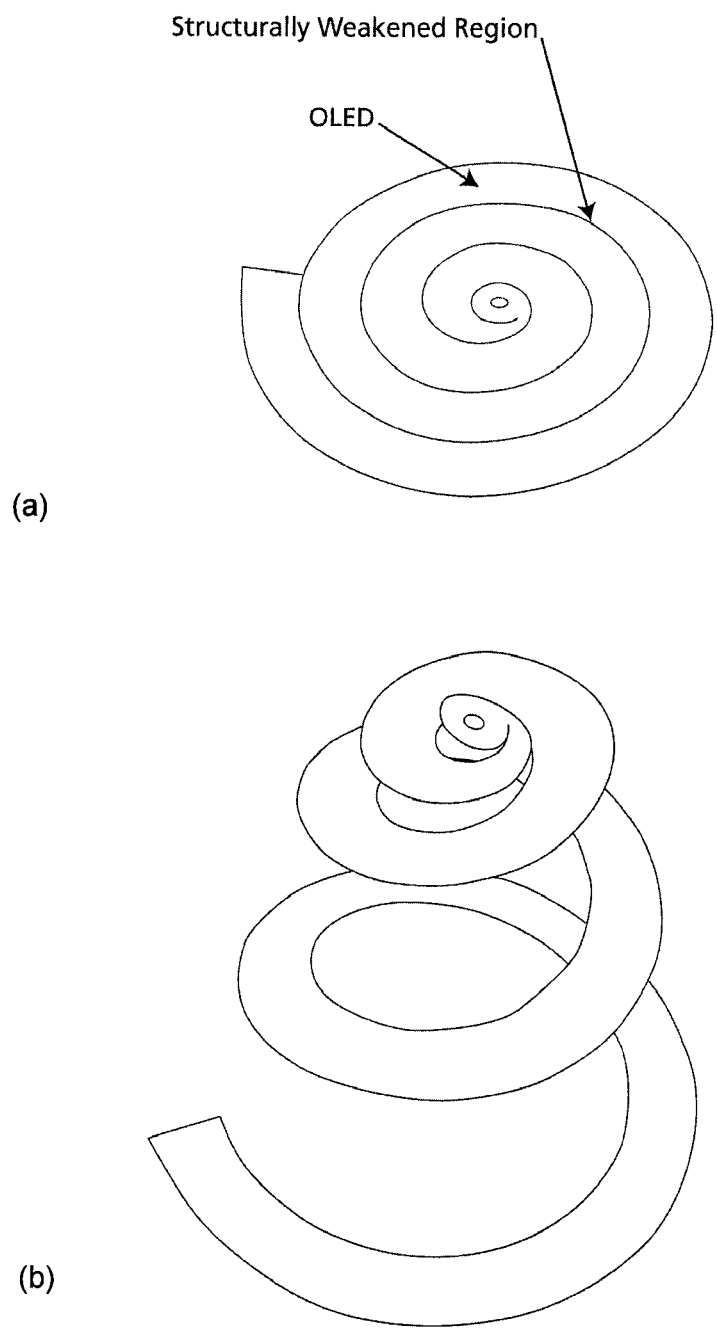
FIG. 7 shows a conical spiral device in (a) a flat configuration, and (b) in a self-supporting three dimensional configuration suspended from an external contact point.

In one embodiment, the three dimensional shape is a conical spiral. An example of such a device is depicted in FIG. 7. A first device in the shape of a conical spiral is flat in one configuration, as shown in FIG. 7(a), and has the shape depicted in FIG. 7(b) in the second, three dimensional configuration. In one embodiment, the first device is a lamp, which may be used in a variety of consumer and commercial situations where lighting is necessary. In another embodiment, the OLED conforms to the shape of the first device. By "conforms" it is meant that the OLED adapts to any change in the curvature of the flexible substrate as the first device goes from the first configuration to the second configuration without any significant changes to the OLED's physical or optical performance. The height of the cone in the conical spiral can be controlled by the flexural rigidity and weight of the substrate and the separation and pattern of the cuts.

In one embodiment, the first device is attached to at least one contact region. The contact region can be any external surface or attachment point that does not constrain the shape of the first device in the second configuration. For example, the conical spiral device in FIG. 7 may be hung from any suitable external attachment point, such as a hook, nail, screw etc., or hung from the ceiling by a thread. The contact region can also be used for mechanical and electrical contact.

Figure 8:
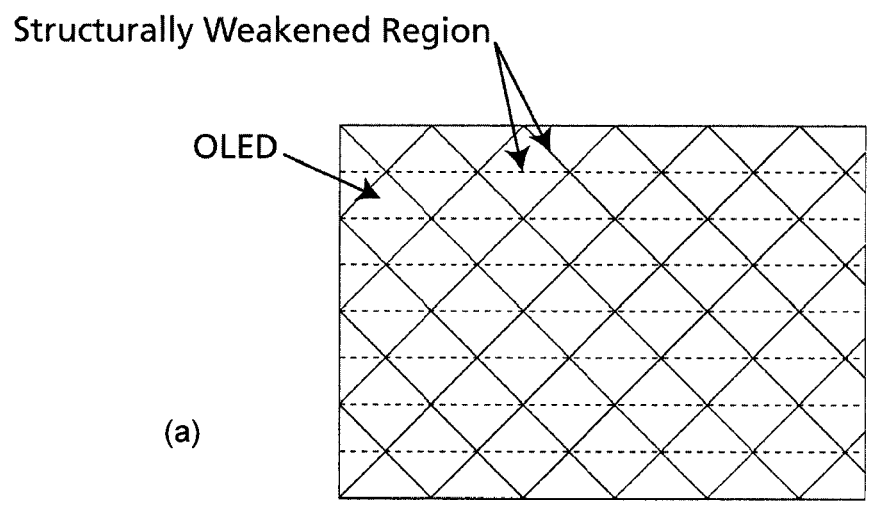
FIG. 8 shows an origami lamp in (a) a flat configuration and (b) in a second, three dimensional configuration.
Figure 8:
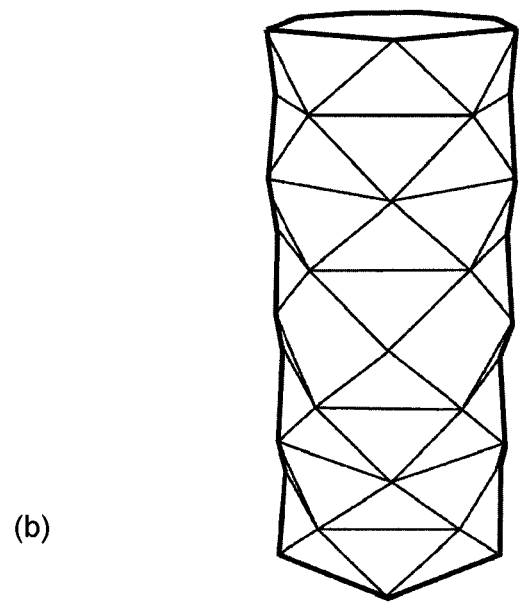

In one embodiment, the three dimensional shape is an origami lamp. An example of such a device is depicted in FIG. 8. A first device is flat in one configuration, as shown in FIG. 8(a), and has the shape depicted in FIG. 8(b) in the second, three dimensional configuration. In one embodiment, the OLED conforms to the shape of the first device. The origami lamp may be used in a variety of consumer and commercial situations where lighting is necessary. The flexural rigidity of the origami lamp should be low enough that the flexible substrate and OLED may be folded along the structurally weakened regions and can flex as required between the structurally weakened regions. Flexural rigidity should be high enough that the flexible substrate and OLED may maintain its shape without collapsing.

In one embodiment, the first device is attached to at least one contact region. The contact region can be any external surface or attachment point that does not constrain the shape of the first device in the second configuration. For example the origami lamp may be suspended from an attachment point, such as a hook, nail, screw etc., or hung by a thread. FIG. 8(b) shows an origami lamp device as a self-supporting cylinder; the three dimensional shape is due entirely to the physical properties of the first device. The contact region can be used for mechanical contact and for electrical contact. In other embodiments, other lamp designs could be used.

In one embodiment, the first device comprises metal foil, plastic, fabric, glass, paper or combinations thereof. In one embodiment, the metal foil comprises an aluminum foil, stainless steel foil, copper foil or combinations thereof. Thus the substrates can comprise single materials, compound materials, and/or laminated layers. In one embodiment, the stainless steel foil has a thickness of about 20 microns to about 150 microns. In another embodiment, the plastic comprises polyethylene terephthalate, polyethylene naphthalate, or combinations thereof. In one embodiment, the plastic has a thickness of about 40 microns to about 400 microns. In one embodiment, the metal foil comprises aluminum foil. In one embodiment, the aluminum foil has a substrate thickness of about 30 microns to about 300 microns. In one embodiment, the glass comprises flexible glass. In one embodiment, the flexible glass comprises borosilicate glass with a thickness of about 50 microns to about 500 microns. The exact thickness requirements depend on the substrate processing, lamination, device layers etc., and are readily ascertainable by one of skill in the art.

Flexible metal and plastic substrates often suffer from higher asperity count and high root mean square (RMS) surface roughness. Various planarization methods can be used, such as deposition of a resist (e.g. polyimide), followed by a hard bake, or alternatively deposition of an inorganic dielectric using methods such as PECVD. In one embodiment, the first device further comprises an insulating material deposited between the surface of the first device and the OLED. In one embodiment, the insulating material comprises a polyimide layer. The planarization layer may remove electrical contact between the OLED and the substrate. This is particularly important in the case of metal foils, where in some circumstances it may be advantageous not to have electrical current flowing through the substrate. The planarization layer may also act as a permeation barrier, which is particularly important in the case of plastic substrates, where oxygen and moisture can permeate through the substrate. In one embodiment, the polyimide layer has a thickness of about 2 microns to about 20 microns.

With respect to OLED deposition, the anode and/or bus lines can be deposited by VTE or sputtering through a shadow mask, or blanket deposited and then patterned using photolithography. Examples of anode materials include, but are not limited to, IZO, ITO, Al, Ag or combinations thereof. Individual anode areas are preferably patterned around the cuts/scores in the substrate. Examples of bus line materials include, but are not limited to, Al, Ag, Au, Cu. Bus lines may pass over score marks made on the reverse of the substrate. In one embodiment, the OLED comprises a single pixel, which can be a large area pixel. In another embodiment, the OLED comprises a plurality of pixels. In one embodiment, the plurality of pixels are connected in series, and in another embodiment the plurality of pixels are connected in parallel. In some embodiments individual pixels are connected in parallel using bus lines, whereas in other embodiments individual pixels are connected in series, where the cathode of one pixel is in electrical contact with the anode of an adjacent pixel. In some embodiments the pixels are connected by a combination of parallel and series connections.

In one embodiment, the anode pixel layout is shown in FIG. 3(a). In this embodiment, the first device comprises 16 pixels separated by structurally weakened regions, which curve around to form a conical spiral. The anode can comprise 3000 Å Al deposited by VTE through a shadow mask onto a polyimide planarization layer. In one embodiment, the anode layer is reflective, giving rise to a top-emitting OLED. In one embodiment, the organic layers are disposed onto the substrate using VTE. In one embodiment, the OLED stack comprises 100 Å LG101 as a hole injection layer (HIL) (supplied by LG Chemicals of Korea), 3800 Å NPD as a hole transport layer (HTL), a 200 Å thick first emissive layer (EML1), a 75 Å thick second emissive layer (EML2), a 50 Å thickness blocking layer (BL), a 450 Å thickness electron transport layer (ETL) of LG201 (supplied by LG Chemicals of Korea) doped with 65% lithium quinolate (Liq), a 10 Å thickness layer of Liq as an electron injection layer (EIL), and a cathode. Organic layers comprising the OLED can be deposited through a shadow mask, the design of which is shown in FIG. 3(b). In one embodiment, the cathode layer is deposited onto the organic layers through a shadow mask using VTE. In one embodiment, a semi-transparent compound cathode of 120 Å Mg:Ag (10% Ag) can be deposited through the shadow mask design shown in FIG. 3(c). The number and character of the various layers in the OLED described above can be readily changed by one of ordinary skill in the art to achieve any desired OLED properties.

Figure 3:
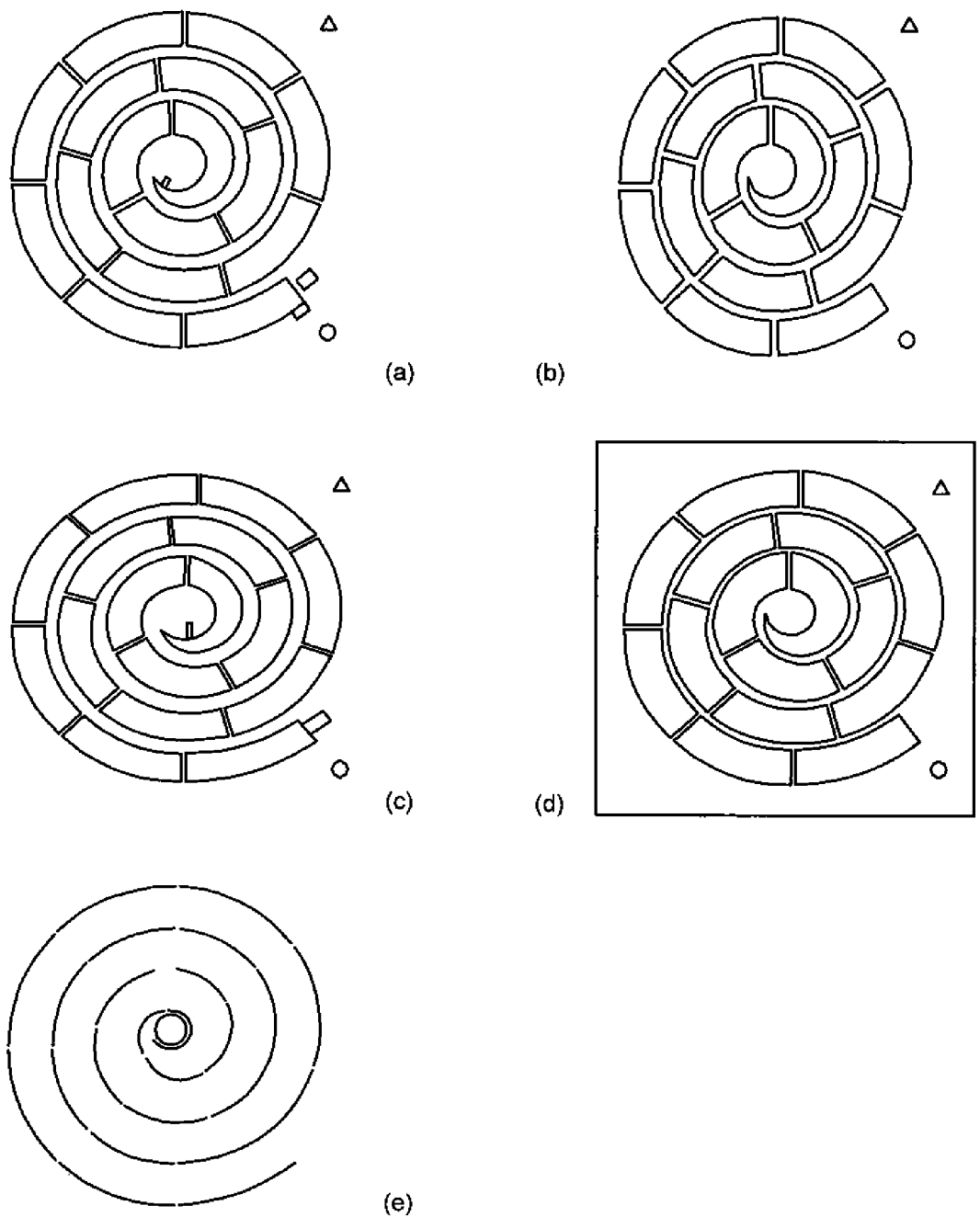
FIG. 3 shows layouts of (a) anode, (b) organic, (c) cathode, (d) thin film encapsulation layer and (e) cutting marks for a conical spiral device.
Figure 4:
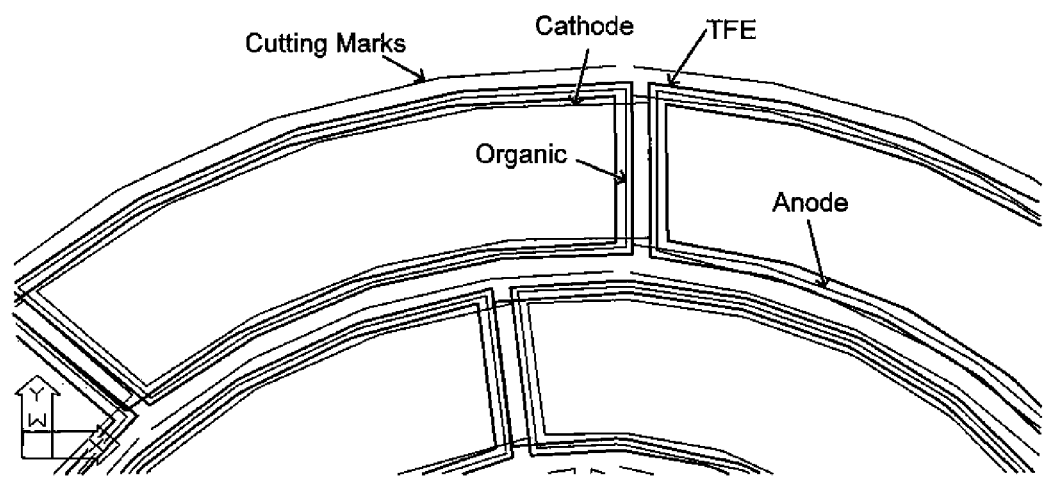
FIG. 4 shows an enlargement of the layout in FIG. 3.

In the embodiment shown in FIG. 3, the 16 pixels are connected in series. The cathode from the first pixel contacts the anode of the second pixel and so on. This is shown in FIG. 4. Advantages of series connections are well described in the art (e.g. U.S. Pat. No. 7,049,757 B2). These advantages include low current that is independent of the number of pixels, and a tolerance to electrical shorting, such that if one pixel shorts, other pixels will continue to operate. One disadvantage of series connection is high voltage, which increases linearly with the number of pixels. In this example, the required voltage is 16 times that required for a single pixel. In FIGS. 3(a) and 3(c) the anode and cathode contact pads can be seen. These are used for making electrical contact to the OLED devices. To illuminate all 16 OLED devices, the electrical connection should be made to the cathode pad at the base of the spiral, and to the anode pad at the center of the spiral. Current will then flow between the anode and cathode contacts illuminating each OLED device. In one embodiment, a micro-wire can be connected to either the cathode pad or the anode pad. The micro-wire can run along the rear of the substrate (which is electrically isolated from the OLED device by the insulating layer) toward the region of the opposing contact pad. A single contact region can then be used to deliver electrical current to the device.

In one embodiment, the OLED is covered with a thin film encapsulation layer (TFE). In one embodiment, the thin film encapsulation layer completely covers the OLED. In one embodiment, a small bridge between adjacent devices where the anode of one pixel contacts the cathode of an adjacent pixel is uncovered by the thin film encapsulation layer. When this bridge remains exposed, it is possible to select a sub-set of the pixels to illuminate. Only the pixels between the two points where electrical contact is made will illuminate. In one embodiment, the small bridge between adjacent devices is reinforced with a conductive material. This ensures reliable electrical contact and provides mechanical stability. Such an arrangement may be especially desirable where the bridge remains exposed, and where a thin and semi-transparent cathode material is used.

When fabricating an OLED on a flexible substrate, in order to maintain flexibility, the thin film encapsulation layer must also have mechanical flexibility. In one embodiment, the thin film encapsulation layer does not cover the anode or cathode contact pads, as these are needed for making electrical connection to the OLED. In one embodiment the anode and cathode pads are reinforced with conductive material. FIG. 3(d) depicts the thin film encapsulation layer deposited on the OLED. FIG. 4 is a close up representation of one embodiment of the first device, showing the various electrode and film layers (TFE is the thin film encapsulation layer).

It is common to use thin film encapsulation layers that are a combination of organic and inorganic materials. The inorganic materials provide an effective barrier against the permeation of moisture and oxygen, while the organic materials provide mechanical flexibility and help to distribute any faults in the inorganic layers, which increase the diffusion path length through the barrier.

In one embodiment, the at least one structurally weakened region is substantially free of the thin film encapsulation layer. By "substantially free of the thin film encapsulation layer" it is meant that the footprint of the thin film encapsulation layer does not extend past the structurally weakened regions within the limits of precision of the thin film deposition technique, for example, PECVD. This is especially important, where the structurally weakened region is formed after deposition of the thin film encapsulation layer. In another embodiment, a hard coat layer is present on top of the thin film encapsulation layer. The hard coat layer can provide additional protection to the thin film encapsulation layer and the OLED. Exemplary materials for the hard coat layer include, but are not limited to, polyimide, polyurethane, and polyacrylate. In one embodiment, the thin film encapsulation layer has a thickness of less than 10 microns.

In one embodiment, one or more of the edges of the first device comprise a protective coating. The protective coating may smooth the edge of the device if this is required for a particular application. In one embodiment, the protective coating can comprise metal foil, plastic, fabric, flexible glass, paper or combinations thereof. In one embodiment, the protective coating has a flexural rigidity of about $10^{-1}$ Nm to about $10^{-6}$ Nm. In one embodiment, the protective coating has flexural rigidity that closely matches that of the substrate. In one embodiment, the protective coating may be used to make electrical contact to the device. In one embodiment the protective coating is a hard coat layer comprising polyimide, polyurethane or polyacrylate.

In order to transform a two dimensional flexible substrate and OLED into a three dimensional light source without the use of additional external constrains, cuts, scores, perforations or folds can be made in the flexible substrate, and the flexible substrate and OLED should have the correct balance of flexibility and rigidity. That is, the finished device should be flexible enough to allow some conformability, but rigid enough to hold its own shape without external support. For example, in one embodiment described herein, after cutting, the device should form a three dimensional conical spiral under its own weight. If the device is too rigid, the cone will be too flat, while if the device is too flexible, the cone will be too elongated.

In one embodiment, the first device is folded along at least one structurally weakened region. In one embodiment, the first device is self-supporting. By "self-supporting" it is meant that the first device can maintain its three dimensional configuration without the use of external constraints as described above. In one embodiment, the flexible substrate of the first device is scored and folded into a box or similar structure. If the substrate is too rigid, it will not flex easily, and there will be excess force exerted onto the sides of the box. Whereas, if the substrate is too flexible, it will collapse without holding its shape.

A useful measure of the balance between flexibility and rigidity is flexural rigidity. This is defined as the force couple required to bend a rigid structure to a unit curvature. For a uniform substrate, flexural rigidity can be described mathematically as:

$$D = Et^3/12(1-\mu^2) \tag{1}$$

Where D is flexural rigidity (in Nm), E is Young's modulus (in $Nm^{-2}$), $\mu$ is Poisson's ratio and t is the thickness of the substrate (in m). This equation is described in Rogers & Bogart, J. Mater. Res., Vol. 16, No. 1, January 2001. The more flexible the substrate, the lower the flexural rigidity. The flexural rigidity of any substrate can be theoretically calculated if Young's modulus, Poisson's ratio and the thickness of the substrate are known. However, in practice, especially when dealing with thin films, flexural rigidity may be affected by processing details, lamination of additional layers, non-uniformity across the film, etc.

A preferred approach is to measure flexural rigidity. This can be done using the principle of the heavy elastica, as described in W. G. Bickley: The Heavy Elastica, Phil. Mag. Vol. 17 Mar. 1934 p. 603-622. A couple of specific measurement techniques are described in NASA Technical Note D-3270: Techniques for the Measurement of the Flexural Rigidity of Thin Films and Laminates, H. L. Price, April 1966. These are (1) the heart loop method and (2) the cantilever method. The heart loop method is only suitable for very thin films (typically <20 microns) with very low flexural rigidity. The cantilever method is described in detail in BS 3356:1990, British Standard Method for Determination of Bending Length and Flexural Rigidity of Fabrics, British Standards Institution © 1999.

Figure 5:
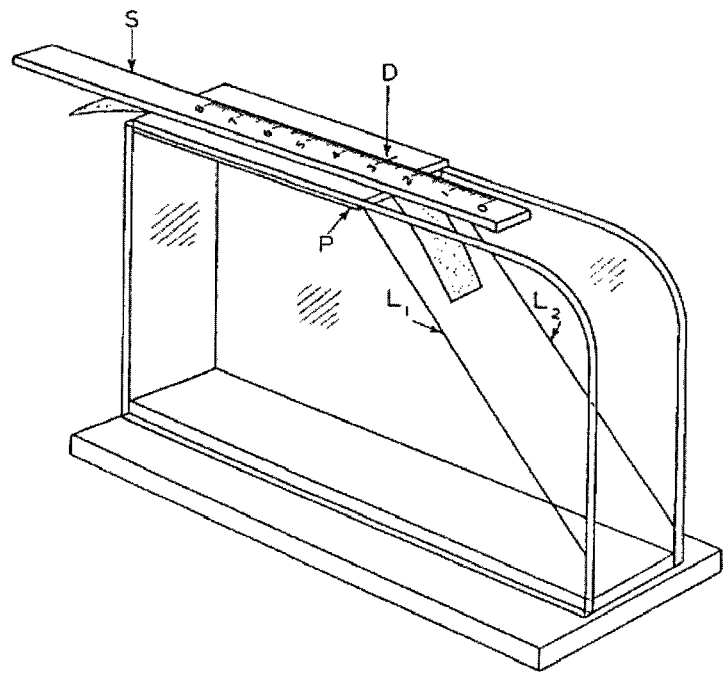
FIG. 5 shows a fixed angle flexometer, which can be used to determine flexural rigidity.

It may be difficult to calculate flexural rigidity for thin films from material properties or from data provided in a textbook. This is especially true for composite films or multilayer films. However, once a measurement is made for a particular structure, flexural rigidity can be readily altered in a reasonably predictable way by one of skill in the art by adjusting parameters such as substrate thickness. Here we focus on the cantilever method for determining flexural rigidity. The apparatus required is a fixed angle flexometer, which is shown in FIG. 5 (adapted from BS 3356:1990, FIG. 1). The basis of this measurement is to quantify the deflection of a strip of material under its own weight. This is particularly relevant with respect to the described embodiment, where a conical helix is designed to extend under its own weight. The measurement technique may be used to quantify the flexural rigidity of substrates of finished devices.

A rectangular strip of material is supported on a horizontal platform in a direction perpendicular to the edge of the platform. The strip is extended in the direction of its length so that an increasing part overhangs and bends down under its own weight. When the tip of the strip of material has reached a plane passing through the edge of the platform and inclined at an angle of θ=41.5° below the horizontal, the overhanging length L is equal to twice the bending length C of the specimen (C=0.5 L at θ=41.5°).

Figure 6:
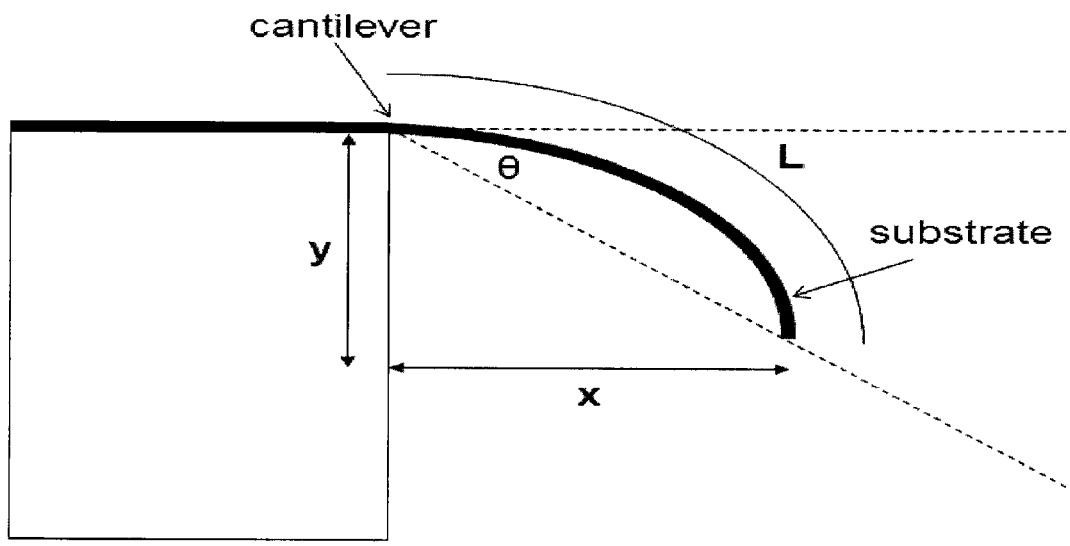
FIG. 6 shows a heavy elastica cantilever method used to extract bending length C.

Bending length (in m) is denoted by C, where C is the cube root of the ratio of flexural rigidity to the weight per unit area of the material: $D=WC^3$, where W is weight per unit area (in $N \cdot m^{-2}$), which for a uniform strip is given by $W=\rho t g$, such that:

$$D=WC^3=\rho t g C^3 \quad (2)$$

Where ρ is density (in $Kgm^{-3}$), g is gravitation acceleration (9.81 $ms^{-2}$) and t is the thickness of the substrate (in m). Bending length C is equal to the length of a rectangular strip of material that will bend under its own weight to an angle of 7.1° (see BS 3356:1990). Thus by measuring the overhang length L at θ=41.5°, we can determine C and substitute into equation (2) to determine flexural rigidity. This result can then be compared to that using equation (1). FIG. 6 shows some of the quantities schematically.

The method described above, where θ=41.5° and L is measured is preferred. However, for certain materials the bending length may be prohibitively long. An alternative approach is to fix the overhang length L, and to extract θ from measurements of x and y as shown in FIG. 6, where $\theta=\tan^{-1}(y/x)$. Once L and θ are known, a simple look-up table (taken from Bickley 1966 and Price 1934) can be used to relate bending length C to overhang length L for a given angle θ, where θ ranges from 10.0° to 55.5° in steps of 0.5°. The look-up table is given in Table 1. Bending length C can then be related to flexural rigidity using equation (2). Note that extrapolating to θ=7.1°, bending length C=overhang length L.

TABLE 1

Relationship between deflection angle and ratio of the bending length to the overhang length in heavy elastica cantilever tests. Table 1 is adapted from NASA technical note D-3270.

| Deflection angle, θ, deg | c/l |
|---|---|
| 10.0 | 0.887 |
| 10.5 | .872 |
| 11.0 | .856 |
| 11.5 | .843 |
| 12.0 | .833 |
| 12.5 | .822 |
| 13.0 | .811 |
| 13.5 | .800 |
| 14.0 | .789 |
| 14.5 | .781 |
| 15.0 | .772 |
| 15.5 | .763 |
| 16.0 | .754 |
| 16.5 | .746 |
| 17.0 | .738 |
| 17.5 | .731 |
| 18.0 | .722 |
| 18.5 | .716 |
| 19.0 | .708 |
| 19.5 | .702 |
| 20.0 | .696 |
| 20.5 | .689 |
| 21.0 | .684 |
| 21.5 | .677 |
| 22.0 | .671 |
| 22.5 | .665 |
| 23.0 | .658 |
| 23.5 | .654 |
| 24.0 | .648 |
| 24.5 | .642 |
| 25.0 | .638 |
| 25.5 | .632 |
| 26.0 | .627 |
| 26.5 | .623 |
| 27.0 | .617 |
| 27.5 | .613 |
| 28.0 | .607 |
| 28.5 | .603 |
| 29.0 | .598 |
| 29.5 | .594 |
| 30.0 | 0.589 |
| 30.5 | .584 |
| 31.0 | .580 |
| 31.5 | .575 |
| 32.0 | .571 |
| 32.5 | .567 |
| 33.0 | .563 |
| 33.5 | .558 |
| 34.0 | .554 |
| 34.5 | .550 |
| 35.0 | .546 |
| 35.5 | .542 |
| 36.0 | .538 |
| 36.5 | .534 |
| 37.0 | .530 |
| 37.5 | .527 |
| 38.0 | .524 |
| 38.5 | .521 |
| 39.0 | .518 |
| 39.5 | .514 |
| 40.0 | .511 |
| 40.5 | .508 |
| 41.0 | .504 |
| 41.5 | .500 |
| 42.0 | .496 |
| 42.5 | .492 |
| 43.0 | .489 |
| 43.5 | .485 |
| 44.0 | .482 |
| 44.5 | .479 |
| 45.0 | .476 |
| 45.5 | .473 |
| 46.0 | .469 |

TABLE 1-continued

Relationship between deflection angle and ratio of the bending length to the overhang length in heavy elastica cantilever tests. Table 1 is adapted from NASA technical note D-3270.

| Deflection angle, θ, deg | c/l |
| --- | --- |
| 46.5 | .466 |
| 47.0 | .462 |
| 47.5 | .458 |
| 48.0 | .455 |
| 48.5 | .451 |
| 49.0 | .448 |
| 49.5 | .444 |
| 50.0 | 0.441 |
| 50.5 | .437 |
| 51.0 | .434 |
| 51.5 | .431 |
| 52.0 | .428 |
| 52.5 | .425 |
| 53.0 | .422 |
| 53.5 | .419 |
| 54.0 | .416 |
| 54.5 | .413 |
| 55.0 | .410 |
| 55.5 | .408 |

It should be noted that these measurements are sensitive to many parameters. To improve measurement accuracy, care should be taken to avoid build-up of static charge on the instrument of material samples, and samples shown be sheltered from external air current. Measurements should be taken at STP. Additionally, it should be noted that any lamination or directional machining/polishing will affect the measured flexural rigidity, especially for thin films. Measurement of flexural rigidity using this technique has a slight dependence on strip width, which arises from the contact force at the horizontal platform edge. A preferred approach is to fix the width of the strip when measuring flexural rigidity of films using this technique. The strip width can be from about 1.0 cm to about 20.0 cm, from about 1.0 cm to about 15.0 cm, from about 1.0 cm to about 10.0 cm, or from about 1.0 cm to about 5.0 cm. Preferably, the strip width is about 1.0 cm to about 5.0 cm. Across the range of about 1.0 cm to about 5.0 cm, the width dependence of flexural rigidity measurements is minimal. A strip width of 2.5 cm was used for measurements described in Table 3.

As can be seen from above, in order to quantify how a substrate material will deflect under its own weight, we need to determine the bending length C and/or flexural rigidity D of the substrate. The flexural rigidity of 2.5 cm wide stainless steel foil of thickness=25, 50, 100 microns, and a PET (polyethylene terephthalate) substrate of thickness=110 microns was measured. All thicknesses were measured using a micrometer. Standard values for Young's Modulus, Poisson's ratio and density are listed for each substrate in Table 2. Also listed is the calculated flexural rigidity D according to equation (1). Table 3 lists for the same substrates, θ, L, C/L (taken from Table 1 for each θ), C and flexural rigidity measured according to equation (2).

It can be seen from Tables 2 and 3 that there is reasonable agreement between the theoretically calculated and heavy elastica measured values for flexural rigidity. Table 3 shows that the bending length (the length of a rectangular strip of material that will bend under its own mass to an angle of 7.1°) ranges from about 5.1 cm to about 12.9 cm depending on the thickness of the stainless steel foil. These values are reasonable for the conical spiral embodiment reported herein. In one embodiment, the first device comprises a conical spiral that comprises a 30 micron foil as the flexible substrate.

TABLE 2

Flexural rigidity calculated using equation (1) for three stainless steel substrates and one PET substrate.

| | Thickness [micron] | Young's Modulus [GPa] | Poisson's Ratio | Flexural Rigidity [N · m] |
| --- | --- | --- | --- | --- |
| Stainless Steel | 25 | 200 | 0.30 | $2.9 \times 10^{-4}$ |
| Stainless Steel | 50 | 200 | 0.30 | $2.3 \times 10^{-3}$ |
| Stainless Steel | 100 | 200 | 0.30 | $1.8 \times 10^{-2}$ |
| PET | 110 | 2.5 | 0.35 | $3.2 \times 10^{-4}$ |

TABLE 3

Flexural rigidity measured using equation (2) for three stainless steel substrates and one PET substrate.

| | Thickness [micron] | Density [Kg · m$^{-3}$] | Θ | L [m] | C/L | C [m] | Flexural Rigidity [N · m] |
| --- | --- | --- | --- | --- | --- | --- | --- |
| Stainless Steel | 25 | 7700 | 40.0° | 0.100 | 0.511 | 0.0511 | $2.5 \times 10^{-4}$ |
| Stainless Steel | 50 | 7700 | 32.6° | 0.130 | 0.567 | 0.0737 | $1.5 \times 10^{-3}$ |
| Stainless Steel | 100 | 7700 | 10.0° | 0.145 | 0.887 | 0.1286 | $1.6 \times 10^{-2}$ |
| PET | 110 | 1400 | 18.6° | 0.100 | 0.716 | 0.0716 | $5.5 \times 10^{-4}$ |

The results in Tables 2 and 3 allow for the definition of a range of material properties that are preferred for a substrate to have optimized flexural rigidity to hold its own shape. This range can be defined in terms of parameters disclosed herein.

Finally, it should be noted that measurement of flexural rigidity could be made of a plain substrate or of a substrate onto which an OLED device has been fabricated. For substrates with relatively high flexural rigidity (e.g. 100 micron thickness stainless steel foil) the flexural rigidity of the substrate is approximately equivalent to that of a finished device. However, he OLED device layers as well as the insulating, encapsulation and hard coat layers can add some rigidity to the substrate. This additional rigidity can be particularly important for substrate materials with relatively low flexural rigidities. It is preferred that flexural rigidity be measured for a finished device (i.e. after the OLED and any additional layers have been deposited) according to the cantilever heavy elastic method described herein.

In one embodiment, the bending length of the first device is about 1.0 cm to about 25.0 cm. In another embodiment, the bending length of the first device is about 3.0 cm to about 15.0 cm. In one embodiment, the first device has a flexural rigidity of about $10^{-1}$ Nm to about $10^{-6}$ Nm. As discussed above, these parameter ranges are preferred for the manufacture of the devices disclosed herein to ensure proper material properties that allow for the three dimensional shape of OLED devices without any additional external support.

Combination with Other Materials

The materials described herein as useful for a particular layer in an organic light emitting device may be used in combination with a wide variety of other materials present in the device. These other materials are disclosed in U.S. Patent Publication Nos. 2010/0295032 and 2011/0057559, which are incorporated herein by reference.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A first device comprising:
a flexible substrate having at least one flexible organic light emitting device (OLED) deposited thereon,
wherein the first device has a three dimensional shape not constrained by any fixture and the flexible substrate and OLED have a sufficient flexural rigidity to maintain the three dimensional shape;
wherein the first device comprises at least one structurally weakened region; and
wherein the first device has a flexural rigidity of about $10^{-1}$ Nm to about $10^{-6}$ Nm.

2. The first device of claim 1, wherein the at least one structurally weakened region comprises a cut region.

3. The first device of claim 1, wherein the at least one structurally weakened region comprises a scored region.

4. The first device of claim 1, wherein the at least one structurally weakened region comprises a perforated region.

5. The first device of claim 1, wherein the at least one structurally weakened region comprises a folded region.

6. The first device of claim 1, wherein the first device is folded along the at least one structurally weakened region.

7. The first device of claim 1, wherein no complete OLED is deposited on the at least one structurally weakened region.

8. The first device of claim 1, wherein the three dimensional shape is a conical spiral.

9. The first device of claim 1, wherein the first device is attached to at least one contact region.

10. The first device of claim 1, wherein the first device is a lamp.

11. The first device of claim 1, wherein the first device comprises metal foil, plastic, fabric, glass, paper or combinations thereof.

12. The first device of claim 11, wherein the metal foil comprises an aluminum foil, stainless steel foil, copper foil Or combinations thereof.

13. The first device of claim 12, wherein the stainless steel foil has a thickness of about 20 microns to about 150 microns.

14. The first device of claim 11, wherein the plastic comprises polyethylene terephthalate, polyethylene naphthalate, or combinations thereof.

15. The first device of claim 14, wherein the plastic has a thickness of about 40 microns to about 400 microns.

16. The first device of claim 11, wherein the metal foil comprises aluminum foil.

17. The first device of claim 16, wherein the aluminum foil has a thickness of about 30 microns to about 300 microns.

18. The first device of claim 11, wherein the glass comprises a flexible glass.

19. The first device of claim 18, wherein the flexible glass comprises a borosilicate glass and has a thickness of about 50 microns to about 500 microns.

20. The first device of claim 1, wherein the OLED comprises a single pixel.

21. The first device of claim 1, wherein the OLED comprises a plurality of pixels.

22. The first device of claim 21, wherein the plurality of pixels are connected in series.

23. The first device of claim 21, wherein the plurality of pixels are connected in parallel.

24. The first device of claim 1, wherein the OLED is covered with a thin film encapsulation layer.

25. The first device of claim 24, wherein the at least one structurally weakened region is substantially free of the thin film encapsulation layer.

26. The first device of claim 24, wherein a hard coat layer is present on top of the thin film encapsulation layer.

27. The first device of claim 24, wherein the thin film encapsulation layer has a thickness of less than 10 microns.

28. The first device of claim 1, wherein the first device has a bending length of about 1.0 cm to about 25.0 cm.

29. The first device of claim 28, wherein the first device has a bending length of about 3.0 cm to about 15.0 cm.

30. The first device of claim 1, wherein at least one structurally weakened region is formed prior to OLED deposition.

31. The first device of claim 1, wherein the flexible substrate is self-supporting.

32. The first device of claim 1, wherein one or more of the edges of the first device comprise a protective coating.

33. The first device of claim 1, wherein the first device contains no transistors.

34. A first device comprising:
a flexible substrate having at least one flexible organic light emitting device (OLED) deposited thereon, the first device having at least two configurations:
a first configuration wherein the first device is flat; and
a second configuration wherein the first device has a three dimensional shape not constrained by any fixture and the flexible substrate and OLED have a sufficient flexural rigidity to maintain the three dimensional shape;
wherein the first device comprises at least one structurally weakened region; and
wherein the first device has a flexural rigidity of about $10^{-1}$ Nm to about $10^{-6}$ Nm.

* * * * *